United States Patent
Bullock

(10) Patent No.: US 7,183,546 B2
(45) Date of Patent: Feb. 27, 2007

(54) SYSTEM AND METHOD FOR VOLTAGE CONTRAST ANALYSIS OF A WAFER

(75) Inventor: Eugene Thomas Bullock, Fremont, CA (US)

(73) Assignee: Applied Materials, Israel, Ltd., Rehovot (IL)

( * ) Notice: Subject to any disclaimer, the term of this patent is extended or adjusted under 35 U.S.C. 154(b) by 34 days.

(21) Appl. No.: 10/942,312

(22) Filed: Sep. 16, 2004

(65) Prior Publication Data

US 2006/0054816 A1    Mar. 16, 2006

(51) Int. Cl.
*G01N 23/00* (2006.01)
*G21K 7/00* (2006.01)

(52) U.S. Cl. ............. 250/310; 250/306; 250/307; 250/311; 324/751

(58) Field of Classification Search ........... 250/306, 250/307, 310, 311; 324/751
See application file for complete search history.

(56) References Cited

U.S. PATENT DOCUMENTS 6,635,873 B1 *   10/2003   Todokoro et al. ........... 250/310

* cited by examiner

*Primary Examiner*—Jack Berman
*Assistant Examiner*—Jennifer Yantorno
(74) *Attorney, Agent, or Firm*—Tarek N. Fahmi

(57) ABSTRACT

System and a method for electrically testing a semiconductor wafer, the method including: (a) scanning a charged particle beam along at least one scan line while maintaining an electrode located at a vicinity of the wafer at a first voltage that differs from a voltage level of a first scanned portion of the wafer, and collecting charged particles scattered from the first scanned portion; (b) scanning a charged particle beam along at least one other scan line while maintaining the electrode at a second voltage that differs from a voltage level of a second scanned portion such as to control a charging state of at least an area that comprises the first and second scanned portions; and (c) repeating the scanning stages until a predefined section of the wafer is scanned.

29 Claims, 7 Drawing Sheets

SYSTEM AND METHOD FOR VOLTAGE CONTRAST ANALYSIS OF A WAFER

FIELD OF THE INVENTION

This invention relates to systems and methods for inspecting and testing semiconductors wafers during circuit fabrication and, in particular, for testing wafers in a voltage-contrast mode.

BACKGROUND OF THE INVENTION

Integrated circuits are very complex devices that include multiple layers. Each layer may include conductive material, isolating material and/or semi-conductive materials. These various materials are arranged in patterns, usually in accordance with the expected functionality of the integrated circuit. The patterns also reflect the manufacturing process of the integrated circuits.

Conductive layers usually include conductors made of conductive materials, whereas the conductors are separated by isolating materials such as various oxides. The dielectric layers are located between the conductive layers in an interlaced manner. Conductors of distinct conductive layers may be connected to each other and/or to the substrate by conductive materials (termed interconnects or vias) located within the dielectric layers. The substrate may include semi-conducting materials and at least a portion of the substrate is connected to a virtual ground.

Various inspection and failure analysis techniques evolved for inspecting integrated circuits both during the fabrication stages, between consecutive manufacturing stages, either in combination with the manufacturing process (also termed "in line" inspection techniques) or not (also termed "off line" inspection techniques). Various optical as well as charged particle beam inspection tools and review tools are known in the art, such as the Compluss™ and SEMVision™ of Applied Materials Inc. of Santa Clara, Calif.

Manufacturing failures may affect the electrical characteristics of the integrated circuits. Some of these failures result from unwanted disconnections between various elements of the integrated circuits. An under-etched via or conductor can be floating instead of being connected to a conducting sub-surface structure.

Such a failure can be detected due to charging differences between said defective structure and non-defective structures. In order to facilitate voltage contrast analysis there must be a charging difference between the defective structure and its surroundings.

Typically the sub-surface structure is electrically connected to the substrate of the wafer or is otherwise connected to an external voltage source or to the ground. Thus, the charging of the structure surrounding can be relatively easily controlled.

The charging of the wafer is usually controlled with an electrode (also known as charge control plate or CCP) positioned above the wafer and held at either a positive or negative voltage as shown in FIG. 1. In order to assure proper charging control the inspected structures (or at least the non-defective structures) are connected to the ground or to some reference voltage source.

U.S. Pat. No. 6,627,884 of McCord, et al. titled "Simultaneous flooding and inspection for charge control in an electron beam inspection machine", and U.S. Pat. No. 6,586,736 of McCord titled "Scanning electron beam microscope having an electrode for controlling charge build up during scanning of a sample", which are incorporated herein by reference describe systems that include a charge control plate.

Various wafers such as silicon over insulator (SOI) wafers and short loop wafers have sub surface structures that are intentionally floating. Thus, scanning the wafers with a charged particle causes charging effects that are hard to manage.

FIG. 1 illustrates a cross section of a typical prior art SOI wafer. The lowest layer is a substrate 210. The substrate is usually made of silicon. An oxide layer (also referred to as BOX) 220 is manufactured above the substrate 210. The upper layer of the SOI wafer includes an inter-dielectric layer 240 through which contact holes were fabricated and then filled with conductive structures (also termed conductors) 250 such as vias, metal lines and the like. Trench insulators, such as oxide-made trench insulators 260 as well as silicon epilayer islands 230, 232 and 234, that are insulated from each other by trench isolators 260 are formed between the inter-dielectric layer 240 and the oxide layer 220.

Non-defective conductors are connected to the silicon epilayer islands while defective conductors are isolated from said islands.

During electron beam inspection of the SOI wafer each of the epilayer islands 230, 232 and 234 acts like a capacitor and is charged to a certain voltage level. This charge does not discharge through the substrate 210 because each island is isolated, by the oxide layer 220 and trench insulators 260.

Many conductors 250 are connected to each silicon epilayer island. Thus, a charge that is built as a result of scanning some conductors affects the charge of conductors that were not yet scanned. Once the SEM 10 scans the latter conductors the contrast between them and their vicinity can be dramatically reduced and even eliminated.

There is a need to provide a system and method for an effective voltage contrast analysis, especially in the presence of severe charging effects.

SUMMARY OF THE INVENTION

A system for electrically testing a semiconductor wafer, the system includes: (a) a charged particle beam source; (b) an electrode located at a vicinity of the wafer; (c) at least one detector, connected to the electrode, adapted to collect charged particles scattered from the wafer; and (d) a controller adapted to: (i) control the charged particle beam such that the charged particle beam scans along at least one scan line while maintaining the electrode at a first voltage that differs from a voltage level of a first scanned portion of the wafer, and to allow the detector to collect charged particles scattered from the first scanned portion; (ii) control the charged particle beam such that the charged particle beam scans along at least one other scan line while maintaining the electrode at a second voltage that differs from a voltage of a second scanned portion such as to control a discharging state of at least an area that includes the first and second scanned portions; and (iii), repeat (i) and (ii) until a predefined section of the wafer is scanned.

A method for electrically testing a semiconductor wafer, the method includes: (a) scanning a charged particle beam along at least one scan line while maintaining an electrode located at a vicinity of the wafer at a first voltage that differs from a voltage level of a first scanned portion of the wafer, and collecting charged particles scattered from the first scanned portion; (b) scanning a charged particle beam along at least one other scan line or the same scan line while maintaining the electrode at a second voltage that differs from a voltage level of a second scanned portion such as to control a charging state of at least an area that comprises the first and second scanned portions; and (c) repeating the scanning stages until a predefined section of the wafer is scanned.

According to an embodiment of the invention stage (b) scans wafer portions that were previously scanned during stage (a), conveniently for discharging at least an area that includes the first and second scanned portions.

Conveniently, the electrode is maintained at a higher voltage than a first scanned portion of the wafer. Conveniently, the electrode is maintained at a lower voltage than a second scanned portion.

According to an embodiment of the invention stage (b) scans wafer portions before they are scanned during stage (a), conveniently for charging at least an area that includes the first and second scanned portions.

Conveniently, the electrode is maintained a vicinity of the wafer at a lower voltage than a first scanned portion of the wafer. Conveniently, the electrode is maintained at a higher voltage than a second scanned portion.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

The following description relates to charged particle microscopes, such as Scanning Electron Microscopes (SEMs), such as step and repeat type SEMs, in which a wafer is scanned by repetitive steps of scanning an area of the wafer (said area defined by the field of view of the SEM) and mechanically introducing a movement between the wafer and SEM to facilitate the scanning of another area. Said movement may also be implemented by electrostatic and/or magnetic fields introduced by various electrostatic and/or magnetic elements such as lens, deflectors and the like. It is noted that other charged particles and even photons may be utilized for detecting voltage contrast. It is further noted that this invention may also be implemented by introducing a substantially constant movement between the SEM and the wafer. The movement may be linear or even rotational, and/or any combination of both movements.

The following examples relate to positive charging and to discharging of wafer portions. It is noted that this is not necessarily so and that this method and system can be applied for negative charging. Furthermore, the invention can be applied to pre-charging as well as discharging.

The term "charging state" relates to the distribution of charge at certain areas or portions of a wafer. It may reflect the total charge, charge density or any other statistics reflecting said charge distribution.

Figure 1:
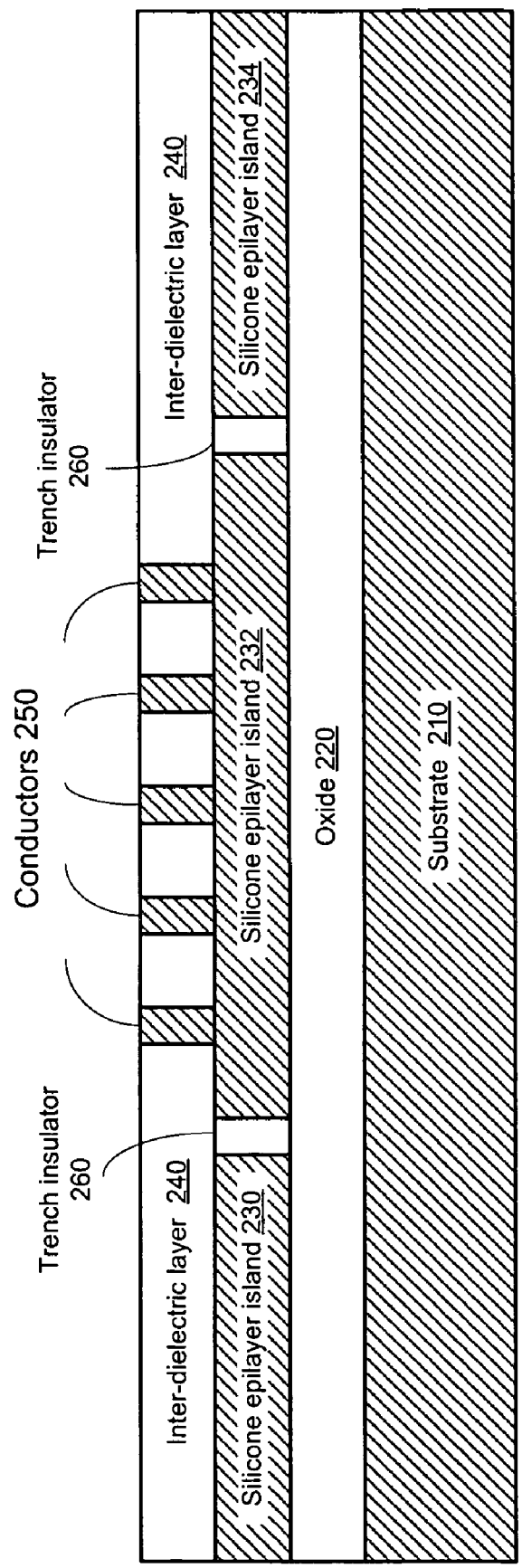
FIG. 1 illustrates a cross section of a typical prior art SOI wafer.
Figure 2:
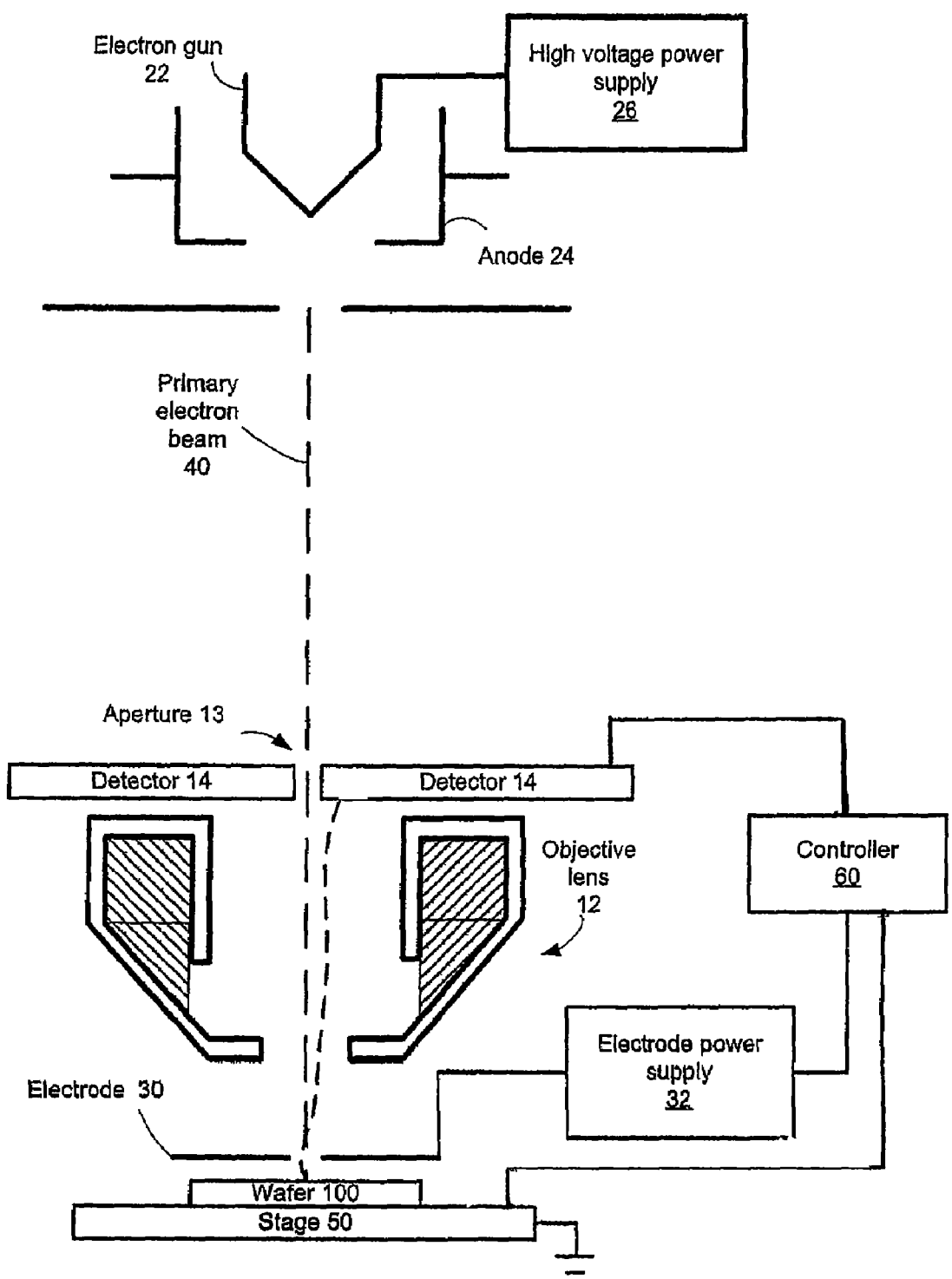
FIG. 2 illustrates scanning electron microscope that is capable of voltage contrast analysis, according to an embodiment of the invention.

FIG. 2 illustrates scanning electron microscope (SEM) 10 that is capable of voltage contrast analysis, according to an embodiment of the invention. SEM 10 includes an electron gun 22, an anode 24 and a high voltage power supply 26 that are operable to generate a primary electron beam 40.

SEM 10 further includes a detector 14 that has an aperture 13 through which the primary electron beam 40 can pass, an objective lens 12 capable of focusing the primary electron beam onto the wafer 100, an electrode 30 positioned at the vicinity of the wafer 100, an electrode power supply 32, a controller 60 and a stage 50. Objective lens 12 usually includes an electrostatic lens and a magnetic lens that introduce an electrostatic field and a magnetic field that leak from the objective lens.

SEM 10 includes additional components such as deflecting units that deflect the primary electron beam such as to scan the wafer, and also includes additional control and voltage supply units that were omitted from FIG. 2 for simplicity of explanation.

In SEM 10 the primary electron beam 40 is directed through aperture 13 within the detector 14 to be focused by the objective lens 12 onto an inspected wafer 100. The primary electron beam interacts with wafer 100 and as a result various types of electrons, such as secondary electrons, back-scattered electrons, Auger electrons and X-ray quanta are reflected or scattered. Secondary electrons can be collected easily and most SEMs mainly detect these secondary electrons. SEM 10 detects secondary electrons by detector 14. The detector 14 is connected to controller 60 that is capable of generating an image of the scanned wafer in response to the amplitude of collected secondary electrons and the location of the primary electron beam 40 in relation to the wafer.

Controller 60 is also connected to the stage 50 for controlling a mechanical movement introduced between wafer 100 and other parts of the SEM 10, such as the electrode. Controller 60 controls the various components of the SEM 10, including the electrode voltage supply unit 32, the deflecting units (not shown) and the like. Typically the deflection units are controlled by a X-scan signal and a Y-scan signal. It is noted that the controller can include multiple software and hardware components, can be a single device or multiple devices.

Conveniently, the stage 50 moves the wafer along a Y-axis while the electrical beam is deflected along an X-axis. This is not necessarily so and other combinations can be applied, including introducing mechanical movement along a first axis and deflecting the electron beam along a second axis that is not normal to the first axis. Furthermore, the direction of successive scans can be the same or opposite of each other.

Although FIG. 2 illustrates a single electrode, this is not necessary and multiple electrodes, as well as an electrode that is segmented to multiple portions, can be applied to control the charging of the wafer 100.

Figure 3:
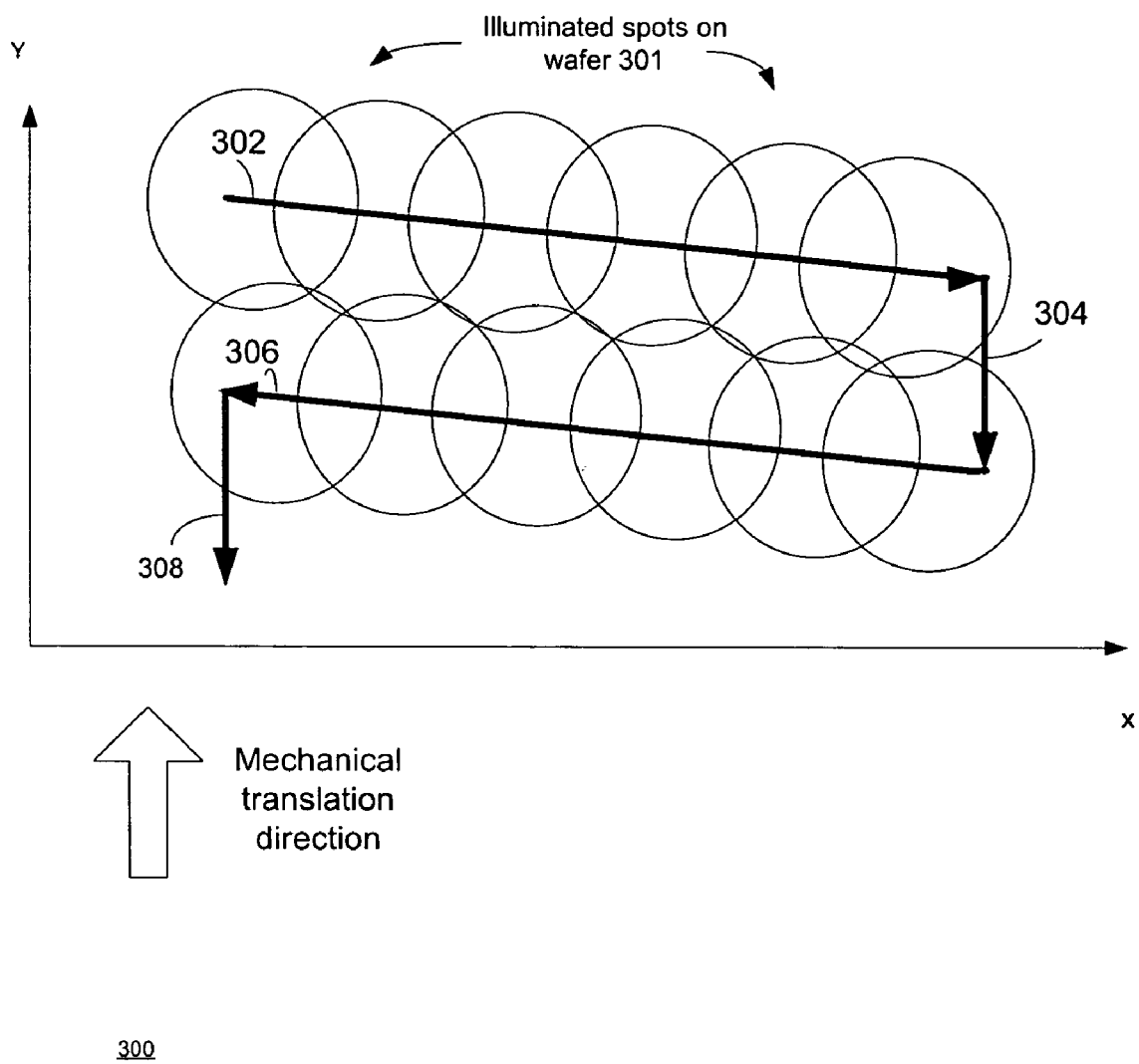
FIG. 3 illustrates a beam deflection pattern, according to an embodiment of the invention.

FIG. 3 illustrates a beam deflection pattern 300, according to an embodiment of the invention.

The beam scan pattern 330 (illustrated in FIG. 4) differs from the beam deflection pattern 300 due to the mechanical movement of the wafer 100 along the Y-axis. Multiple scan lines that are formed due to the deflection pattern and the mechanical movement are further illustrated at FIG. 4.

The beam deflection pattern 300 is rectangular and includes a horizontal scan and image portion 302, vertical blanking portions 304 and 308 and a horizontal discharge portion 306. During the scan and image portion the primary electron beam 40 is focused onto the wafer to provide a spot that is deflected, from left to right. When the primary electron beam 40 is deflected from left to right electrode 30 is held at a first voltage that is more positive than the voltage of the first scanned portion of the wafer. During this scan and image portion 302 SEM 10 collects scattered secondary electrons from the wafer 100 by detector 14 that sends detection signals to controller 60 that in turn is capable of generating an image of the first portion.

The scan and image portion is followed by a blanking portion 304 that includes blanking the primary electron beam 40 and configuring beam deflector to direct the primary electron beam 40 to a point that was previously scanned. Schematically, this blanking portion 304 is illustrated as a vertical line.

The blanking portion 304 is followed by a discharge portion 306 during which the primary electron beam 40 is deflected from right to left while the electrode 30 is maintained at a second voltage that is lower than the voltage of the second portion such as to control a discharging of an area that includes the first and second portions.

The discharge portion 306 is followed by a blanking period 308 that includes blanking the primary beam 40 and configuring beam deflector to direct the primary electron beam 40 to the starting point of the scan and image portion 302. Schematically, this blanking portion 308 is illustrated as a vertical line.

The scanning pattern includes many repetitions of portions 302–308, whereas the mechanical movement of the wafer 100 causes the deflected primary electron beam to scan different portions of the wafer 100.

Figure 4:
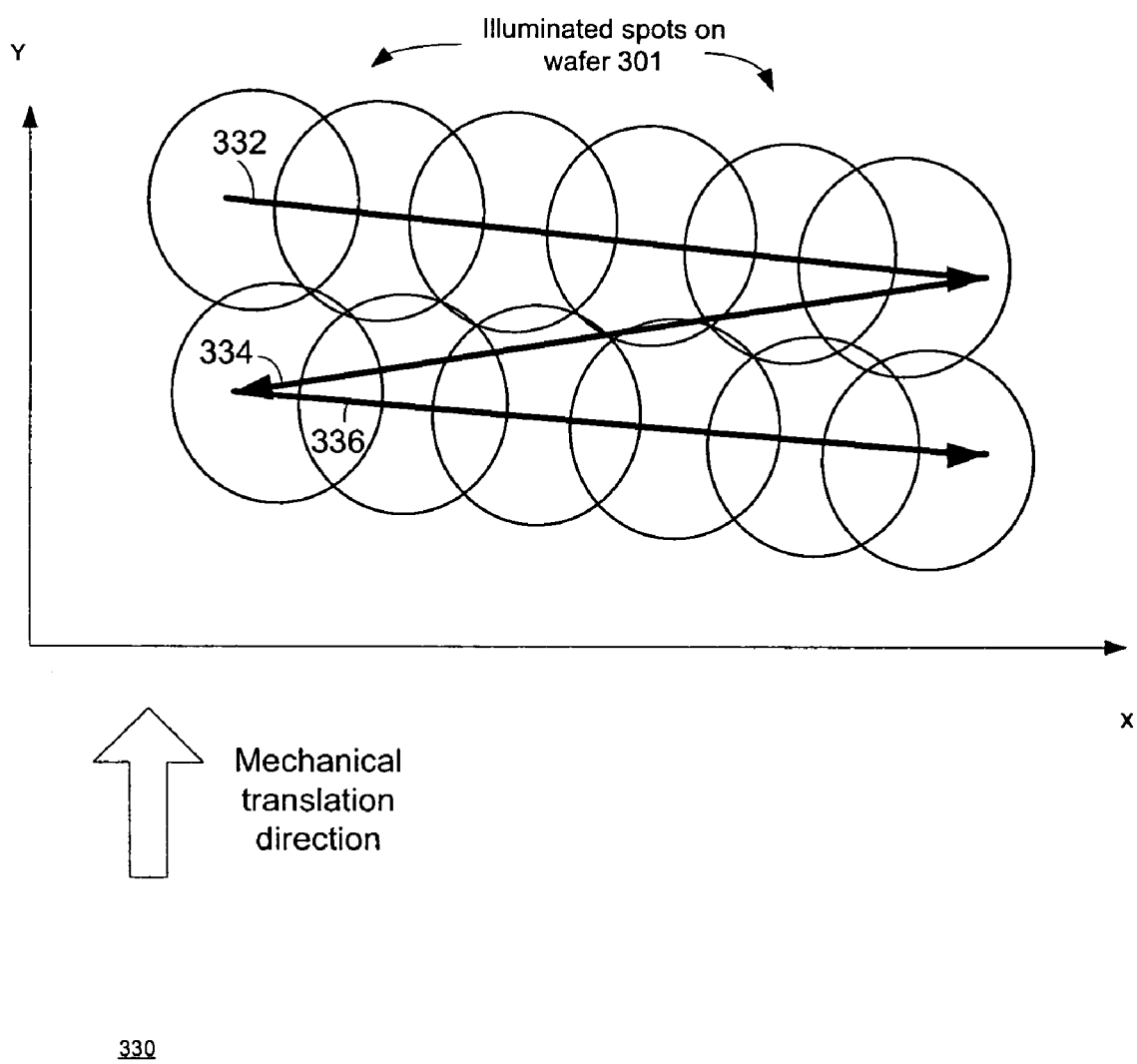
FIG. 4 illustrates multiple beam scan patterns, according to an embodiment of the invention.

FIG. 4 illustrates a beam scanning pattern 330 resulting from multiple iterations of the beam deflection pattern 300 and the movement of the wafer 100, according to an embodiment of the invention.

As the wafer 100 is translated along a Y-axis, the horizontal deflection portion amount in scan lines that are slightly oriented in relation to the horizon.

A first iteration of beam deflection pattern 300 results in first scan line 332 (Corresponding to the scan and image portion 302 of beam deflection pattern 300), and a second scan line 334 (corresponding to the discharge portion 306). It is noted that each of said periods is followed by a blanking period during which the primary electron beam does not scan the wafer 100.

A second iteration of the beam deflection pattern 300 results in first scan line (Corresponding to the scan and image portion 302 of beam deflection pattern 300), and a second scan line (corresponding to the discharge portion 306). It is noted that each of said periods is followed by a blanking period during which the primary electron beam does not scan the wafer 100.

It is noted that the scan and image portion of the scanning pattern can include multiple consecutive scan lines so that the primary electron beam 40 can scan along multiple scan lines before the electrode 30 is maintained at the second voltage.

During the discharge portion electrons are forced back to the wafer 100 by the negative biased electrode 30 and the positive charge generated in the epi-island is passivated. The backwards deflection in Y is utilized to prevent negative charging of the surface oxide from affecting the next line. Once the retrace (second scan line) is complete, the electrode 30 is switched back to the positive voltage, the Y-deflection is reset and the next line is acquired.

The first and second voltages applied to the electrode 30 depend on various parameters, such as the yield of the inter-dielectric layer 240. The yield reflects the ratio between the amount of electrons that hit the inter-dielectric layer 240 and the amount of electrons that are emitted from that layer. For example, a yield that is greater than one means that more electrons exit the layer than hit the layer, thus the layer is positively charged. A yield that is smaller than one means the fewer electrons leave the layer and that the layer is negatively charged.

The inventor found that inter-dielectric layers 240 having yield of about 1.1 to 1.3 can be effectively discharged by applying a second voltage (negative voltage) that is relatively small. The inventor used a negative voltage of 30 v although other voltages can be applied.

When scanning the wafer with a pixel rate of about 160 Mega pixels per second, and with scan lines of about 5000 pixels a scan and image period of about 34 micro-seconds was achieved while a discharge period of 7 microseconds was sufficient to discharge the wafer.

According to another embodiment of the invention the current of the primary electron beam can be altered so that during a scan and image a primary electron beam characterized by a first current is used to scan the wafer while the discharge portion includes scanning the wafer with a primary electron beam characterized by another current. Higher discharge currents can reduce the length of the discharge period.

Figure 5:
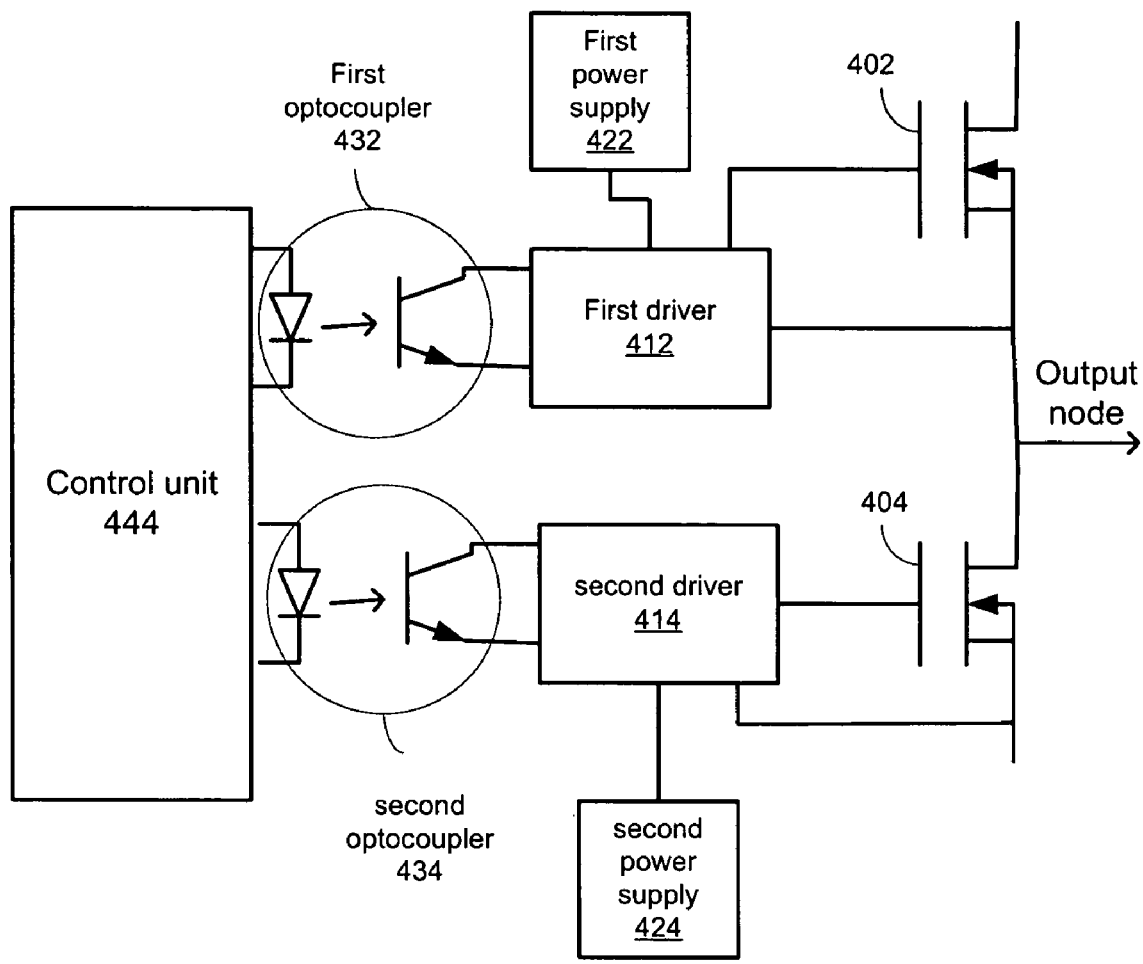
FIG. 5 illustrates an electrode power supply, according to an embodiment of the invention.

FIG. 5 illustrates an electrode power supply, according to an embodiment of the invention.

The electrode power supply 32 includes two power MOSFET transistors 402 and 404 that are serially connected to each other. The MOSFET transistors are connected to each other in series and form an output node of the electrode power supply 32 that is connected to the electrode 30. A first MOSFET transistor 402 is controlled by first driver 412 and is selectively connected to a first voltage supply 422 that provides positive voltage.

The first driver 412 is controlled by a control unit 444 that provides control signals via a first optocoupler 432. The control unit 444 allows the positive voltage of the first power supply 422 to be provided to the electrode 30 during discharge portions of the scanning pattern.

A second MOSFET transistor 404 is controlled by second 414 and is selectively connected to a second voltage supply 424 that provides negative voltage.

The second driver 414 is controlled by a control unit 444 that provides control signals via a second optocoupler 434. The control unit 444 allows the negative voltage of the second power supply 424 to be provided to the electrode 30 during scan and image portions of the scanning pattern.

Conveniently, only up to one MOSFET transistor is active at any given moment. In order to prevent currents between the MOSFET transistors the control unit 444 causes both MOSFET transistors 402 and 404 to be deactivated before one of them is activated. In other words, the control unit 44, by timing the control signals to the optocouplers 432 and 432 assures that each MOSFET transistor is completely turned OFF before the other MOSFET transistor is turned ON. The period during which both MOSFET transistors are turned off is also referred to as a blanking period.

The inventor used positive supply voltages during the scan and image periods in the range of about 0–1000 volts and a negative voltage, during the discharge period, of about 20 V, although positive voltages of few volts to a few tens of volts can also be applied.

The inventor practiced the method on SOI wafers that include isolated epilayer islands but it can be applied to other wafers, including bulk wafers or other wafers that suffer from charging problems.

FIGS. 6a–6d are timing diagrams of various signals, according to an embodiment of the invention.

The timing diagrams illustrate an idle period 510 (from T0 to T1) that is followed by a scan and image period 520 (from T1 to T3), by a discharge period 530 (from T3 to T6) and finally another idle period 540 (from T6 to T7). The scan and image period 520 corresponds to the scan and image portion of the scanning pattern while the discharge period 530 is associated with the discharge portion of the scan pattern. The transition from the scan and image period 520 to the discharge period 530 is associated with a first blanking period 550 (from T2 to T4), while the transition from the discharge period 530 to the second idle period 540 is associated with a second blanking period 560 (from T5 to T7). Both blanking periods were discussed previously in relation to the MOSFET transistors 402 and 404. During these blanking periods the charged electron beam can be blanked and is translated along the Y axis, but this is not necessarily so.

The idle periods 510 and 540 are optional. During the idle period the primary electron beam is not scanned. The idle periods are usually required for re-setting the control circuits after the discharging periods.

It is assumed that the scanning pattern of FIG. 3 is implemented. During the scan and image period the primary electron beam is scanned from left to right, as illustrated by the ramp of the X-ramp deflection signal. During the discharge period 530 the primary electron beam is deflected from right to left (as illustrated by the slope in FIG. 6a).

Figure 6A:
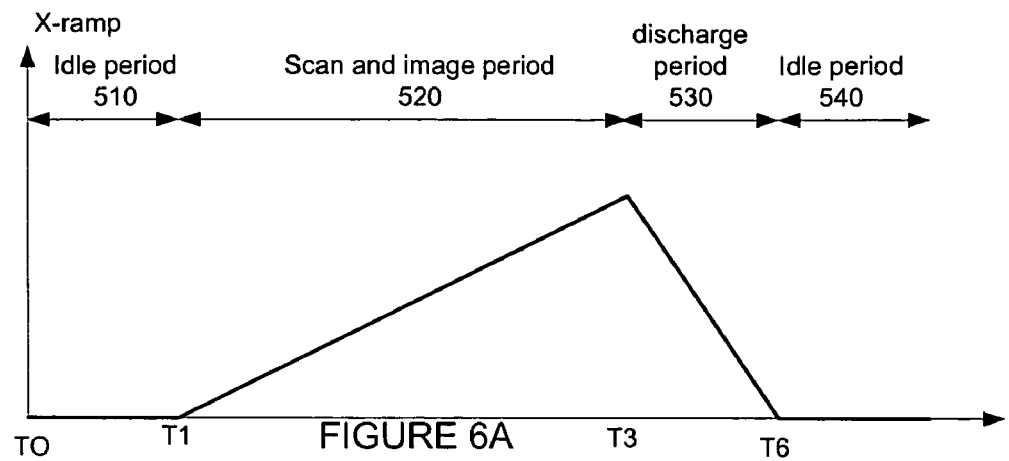
FIGS. 6a–6d are timing diagrams of various signals, according to an embodiment of the invention.
Figure 6B:
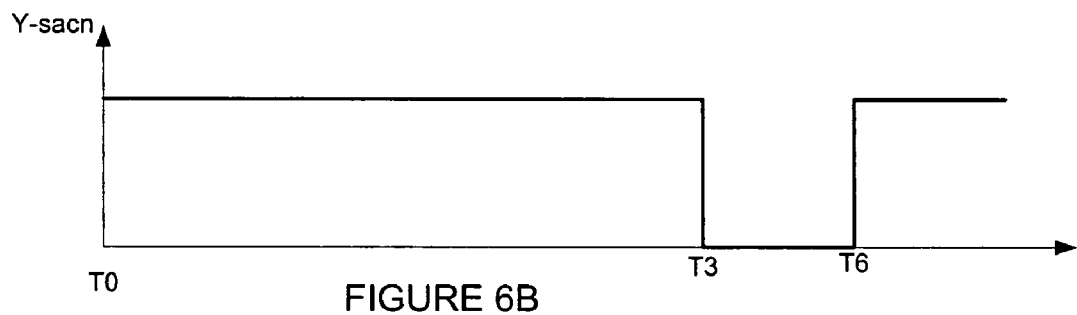

The first fast vertical translation of the primary electron beam (corresponding to the first blanking period 304) is illustrated by a vertical line that occurs at T3, as illustrated in FIG. 6b. The second fast vertical translation of the primary electron beam (corresponding to the second blanking period 308) is illustrated by a vertical line that occurs at T6, as illustrated in FIG. 6b.

Figure 6C:
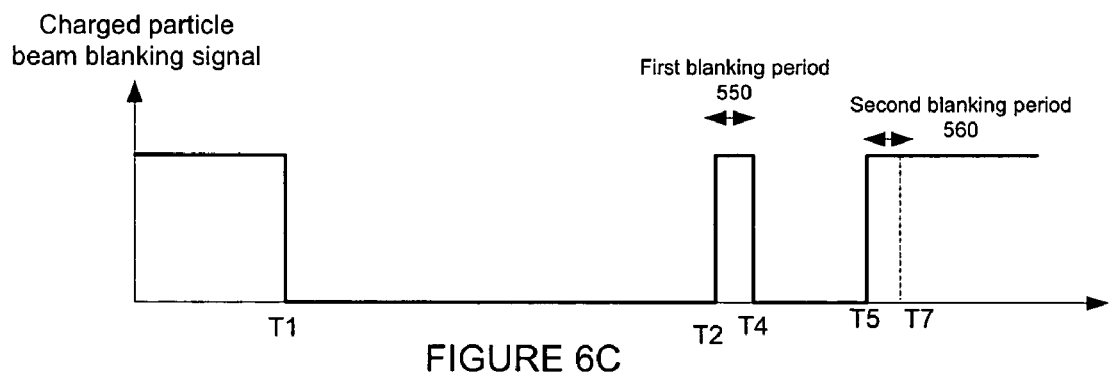
Figure 6D:
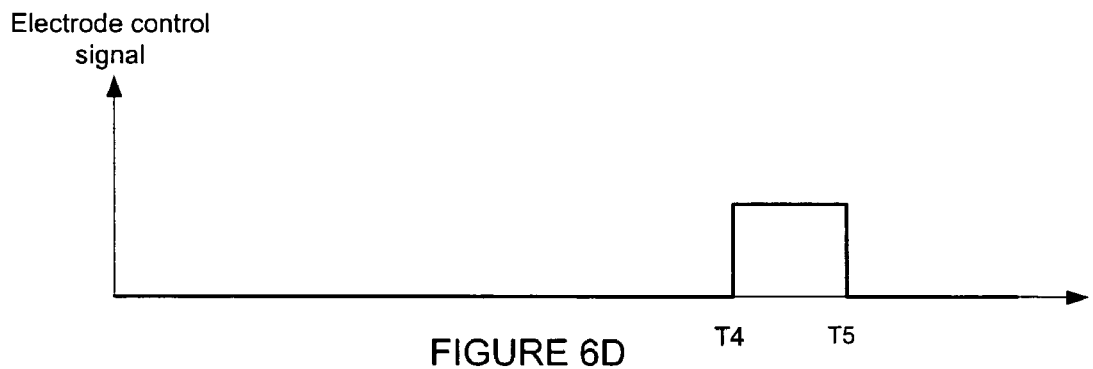

During the discharge period 530, and especially between the blanking periods the voltage supplied to the electrode 30 changes from a first voltage level to another voltage level, for example from positive to negative, as illustrated by FIG. 6d titled "CCP TTL". According to an embodiment of the invention the first and second voltage are substantially the same, conveniently during a pre-charging mode.

Conveniently, the primary electron beam 40 is blanked during idle periods 510 and 540 and during blanking periods 550 and 560, as illustrated by FIG. 6c that illustrates a blanking signal "blanked". The blanking of the primary electron beam 40 allows to avoid charging the wafer in a non-linear way in the proximity of the next line to be acquired. Such non-linear charging can create contrast artifacts in the image causing the image processing to report false defects.

The inventors used an idle periods of about 6 microseconds, while the blanking periods are of about 1 microseconds.

The charged particle beam deflection can be implemented by various prior art methods. The inventors stored the scanning pattern in a FIFO structure. Altering the scan patterns as well as timings requires only inputting new data to the FIFO.

Figure 7:
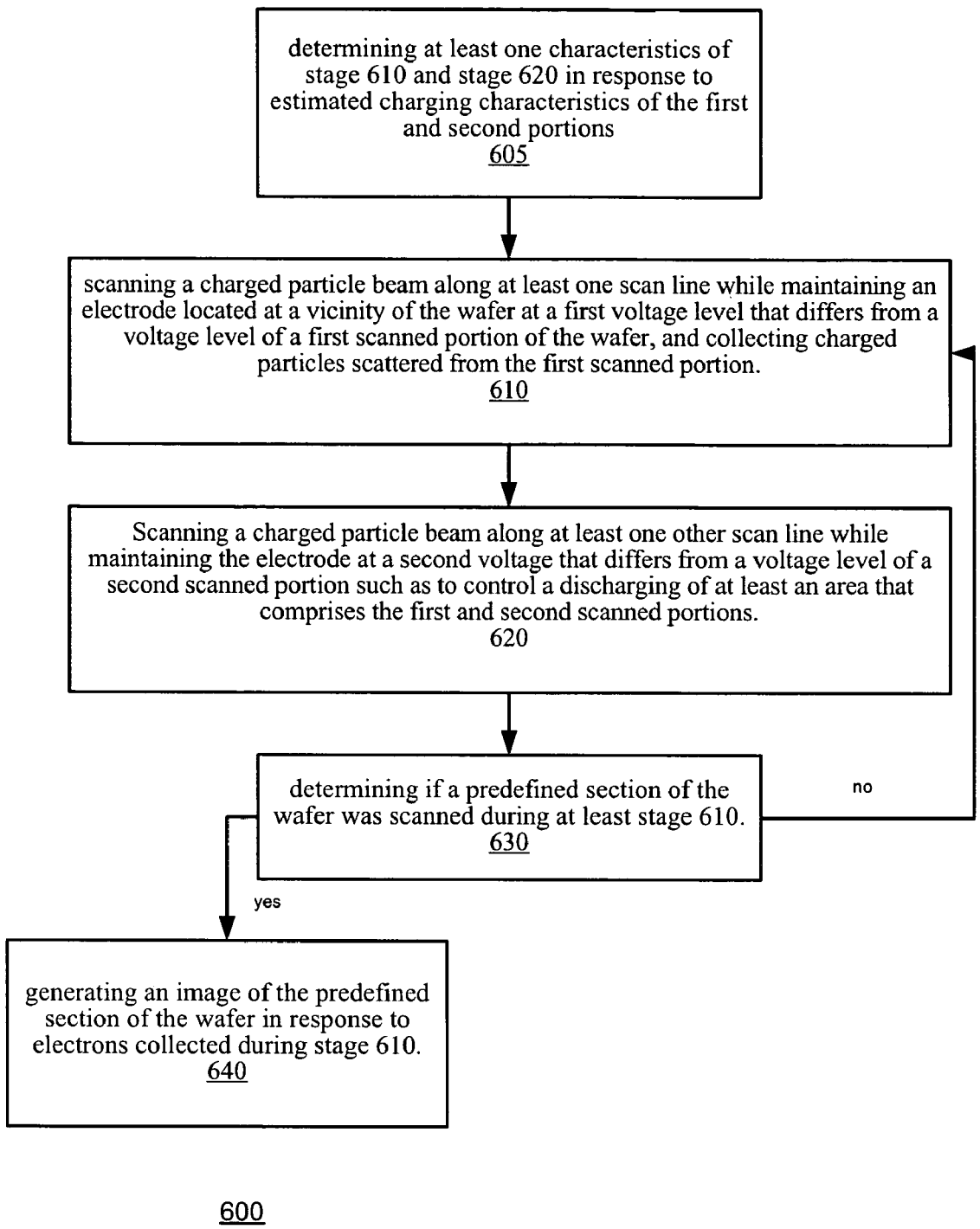
FIG. 7 is a flow chart illustrating a method for electrically testing a semiconductor wafer, according to an embodiment of the invention.

FIG. 7 is a flow chart of a method 600 for electrically testing a semiconductor wafer, according to an embodiment of the invention.

Method 600 starts by stage 610 of scanning a charged particle beam along at least one scan line while maintaining an electrode located at a vicinity of the wafer at a first voltage that differs that a voltage level of a first scanned portion of the wafer, and collecting charged particles scattered from the first scanned portion. The first scanned portion is defined by the at least one scan line.

According to an aspect of the invention the method operates at a positive charging mode of operation and the first voltage is more negative than the voltage of the first scanned portion of the wafer. According to another embodiment of the invention the method operates at a negative charging mode of operation and the first voltage is more positive than the first scanned portion of the wafer.

Stage 610 is followed by stage 620 of scanning a charged particle beam along at least one other scan line while maintaining the electrode at a second voltage that differs from a voltage level of the second scanned portion such as to control a discharge state of at least an area that conveniently includes the first and second scanned portions. The second scanned portion is defined by the at least one scan line.

According to an aspect of the invention the method operates at a positive charging mode of operation and the second voltage is more positive than the voltage of the second scanned portion of the wafer. According to another embodiment of the invention the method operates at a negative charging mode of operation and the second voltage is more negative than the second scanned portion of the wafer.

Stage 620 is followed by stage 630 of determining if a predefined section of the wafer was scanned during at least stage 610. If the answer is positive stage 630 is followed by stage 640 of generating an image of the predefined section of the wafer in response to electrons collected during stage 610.

Stage 630 is followed by stage 610 if the predefined section was not completely scanned. It is noted that during each iteration of stages 610 and 620 a different portion of the wafer is scanned.

Conveniently, stages 610 and 620 include introducing a mechanical movement between the wafer and the electrode.

Conveniently, stage 610 includes scanning the first scanned portion with a charged particle beam of a first current and stage 620 includes scanning the second scanned portion with a charged particle of a second current that differs from the first current. Preferably, the second current exceeds the first current.

According to an embodiment of the invention the charged particle beam of stage 610 differs from the charged particle beam of stage 620 by its landing energy.

Conveniently, the transition from stage 610 to stage 620 involves a deflection of the beam, or at least setting the deflection circuits of the SEM such as to direct a beam to a certain point that is vertically displaced from an ending point of stage 610. Said transition also includes a fast alteration of the voltage supplied to the electrode. Typically, this alteration includes connecting the electrode to a first voltage supply, blanking the first voltage supply and then connecting the electrode to a second voltage supply.

Conveniently, method 600 includes a preliminary stage 605 of determining at least one characteristic of stage 610 and stage 620 in response to estimated charging characteristics of the first and second portions of the wafer. It is further noted that the estimation can be altered during the repetitions of stages 610 and 620. Typically the characteristic is the duration of each stage, the current of the charged particle beam, and/or the size of each portion.

While this invention has been described in connection with what is presently considered to be the most practical and preferred embodiment, it is to be understood that the invention is not limited to the disclosed embodiment. Rather, it is intended to cover various modifications within the spirit and scope of the appended claims.

The invention claimed is:

1. A method comprising:
   (a) scanning a surface of a semiconductor wafer with a charged particle beam along at least one scan line while maintaining an electrode located at a vicinity of the wafer at a first voltage that is more positive than a voltage level of a first scanned portion of the wafer, collecting charged particles scattered from the first scanned portion; and generating an image of the first scanned portion in response to characteristics of the collected charged particles;
   (b) scanning the charged particle beam along at least one other scan line while maintaining the electrode at a second voltage that is lower than a voltage level of a second scanned portion of the wafer so as to passivate a positive charge generated in the wafer during scanning of the first scanned portion;
   (c) repeating scanning steps (a) and (b) until an image of a predefined section of the wafer is generated.

2. The method of claim 1 further comprising introducing a mechanical movement between the wafer and the electrode between scanning step (a) and (b).

3. The method of claim 1 wherein scanning the first scanned portion with the charged particle beam is performed at a first beam intensity and scanning the second scanned portion with the charged particle beam is performed at a second beam intensity that differs from the first beam intensity.

4. The method of claim 3 wherein the second beam intensity exceeds the first beam intensity.

5. The method of claim 1 further comprising a short duration stage of altering a voltage supplied to the electrode between scanning steps (a) and (b).

6. The method of claim 5 wherein altering the voltage comprises coupling the electrode to a first voltage supply, blanking the first voltage supply and then coupling the electrode to a second voltage supply.

7. The method of claim 1 further comprising determining at least one characteristic of scanning step (a) and scanning step (b) in response to estimated charging characteristics of the first and second portions.

8. The method of claim 7 wherein the at least one characteristic is a duration of each scanning step.

9. The method of claim 7 wherein the at least one characteristic is an intensity of the charged particle beam.

10. The method of claim 7 wherein the at least one characteristic is a size of each of the first and second portions.

11. The method of claim 1 wherein the predefined section includes electrically floating chargeable elements.

12. The method of claim 1 wherein the predefined section includes at least one isolated electrically floating chargeable element.

13. The method of claim 1 wherein the first scanned portion is scanned before the second scanned portion.

14. The method of claim 1 wherein the second scanned portion is scanned before the first scanned portion.

15. The method of claim 1 wherein scanning step (a) comprises scanning the first scanned portion with the charged particle beam at a first landing energy and scanning step (b) comprises scanning the second scanned portion with the charged particle beam at a second landing energy that differs from the first landing energy.

16. A system, comprising:
   a charged particle beam source configured to produce a charged particle beam;
   an electrode located in a vicinity of a surface of a semiconductor the wafer;
   at least one detector, coupled to the electrode, adapted to collect charged particles scattered from the wafer when the charged particle beam scans the surface of the wafer; and
   a controller adapted to:
      (i) control the charged particle beam such that the charged particle beam scans along at least one scan line while the electrode is maintained at a first voltage that is more positive than a voltage level of a first scanned portion of the wafer, and to allow the detector to collect charged particles scattered from the first scanned portion;
      (ii) control the charged particle beam such that the charged particle beam scans along at least one other scan line while the electrode is maintained at a second voltage that is lower than a voltage level of a second scanned portion of the wafer so as to passivate a positive charge generated in the wafer during scanning of the first scanned portion; and
      (iii) repeat (i) and (ii) until a predefined section of the wafer is scanned allowing generation of an image of the predefined section of the wafer from electrons collected by the detector during (i).

17. The system of claim 16 wherein the controller is further adapted to control a stage that introduces a mechanical movement between the wafer and the electrode.

18. The system of claim 16 wherein the controller is further adapted to control the intensity of the scanning charged particle beam.

19. The system of claim 16 wherein the electrode is coupled to an electrode power supply that is adapted to alter a voltage supplied to the electrode very rapidly.

20. The system of claim 16 wherein the controller is adapted to determine at least one characteristic of a scanning pattern.

21. The system of claim 20 wherein the characteristic is a duration of each stage that forms the scanning pattern.

22. The system of claim 20 wherein the characteristic is an intensity of the charged particle beam.

23. The system of claim 20 wherein the characteristic is a size of each of the first and second portions that collectively form the scanning pattern.

24. The system of claim 16 wherein the predefined section includes electrically floating chargeable elements.

25. The system of claim 16 wherein the predefined section includes at least one isolated electrically floating chargeable element.

26. The system of claim 16 wherein the first scanned portion is scanned before the second scanned portion.

27. The system of claim 16 wherein the second scanned portion is scanned before the first scanned portion.

28. The system of claim 16 wherein the controller is adapted to control the electron beam to scan the first scanned portion with a first landing energy and to scan the second scanned portion with a second landing energy that differs from the first landing energy.

29. The system of claim 16 wherein the controller is adapted to control the electron beam to scan the first scanned portion with a first current and to scan the second scanned portion with a second current that differs from the first current.

* * * * *